(12) United States Patent
Ochi et al.

(10) Patent No.: US 12,200,957 B2
(45) Date of Patent: Jan. 14, 2025

(54) DISPLAY DEVICE INCLUDING DAM AND SEPARATION WALLS

(71) Applicant: SHARP KABUSHIKI KAISHA, Osaka (JP)

(72) Inventors: Takashi Ochi, Osaka (JP); Tohru Sonoda, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 615 days.

(21) Appl. No.: 17/442,550

(22) PCT Filed: Mar. 29, 2019

(86) PCT No.: PCT/JP2019/014208
§ 371 (c)(1),
(2) Date: Sep. 23, 2021

(87) PCT Pub. No.: WO2020/202325
PCT Pub. Date: Oct. 8, 2020

(65) Prior Publication Data
US 2022/0190289 A1    Jun. 16, 2022

(51) Int. Cl.
*H10K 50/84*   (2023.01)
*H10K 50/844*   (2023.01)
(Continued)

(52) U.S. Cl.
CPC ......... *H10K 50/844* (2023.02); *H10K 59/121* (2023.02); *H10K 59/65* (2023.02);
(Continued)

(58) Field of Classification Search
CPC ...... H10K 50/844; H10K 50/15; H10K 50/16; H10K 50/17; H10K 50/171; H10K 59/121;
(Continued)

(56) References Cited

U.S. PATENT DOCUMENTS

2007/0188093 A1    8/2007   Nagara et al.
2016/0336541 A1*   11/2016  Kim .................... H10K 50/8445
(Continued)

FOREIGN PATENT DOCUMENTS

JP    2007-250520 A    9/2007
WO    WO-2007088813 A1 *   8/2007 ......... H01L 27/3246
(Continued)

*Primary Examiner* — Ida M Soward
(74) *Attorney, Agent, or Firm* — ScienBiziP, P.C.

(57) ABSTRACT

A separation wall is provided in a frame shape along a circumferential edge of a through-hole in a non-display region inside a display region. Both side surfaces of the separation wall are inclined in a reverse tapered shape in which a width between both side surfaces gradually decreases toward a base substrate side. An internal dam wall is provided in a frame shape to overlap a circumferential end portion of an organic insulating film of a sealing film on a display region side of the separation wall in the non-display region. A frame-like slit is provided in a common function layer configuring each of the light-emitting elements to surround the separation wall on the display region side of the separation wall and to pass through the common function layer.

15 Claims, 16 Drawing Sheets

(51) Int. Cl.
    *H10K 59/12*     (2023.01)
    *H10K 59/121*     (2023.01)
    *H10K 59/65*     (2023.01)
    *H10K 77/10*     (2023.01)
    *G06F 1/16*     (2006.01)
    *G09F 9/30*     (2006.01)
    *H10K 50/15*     (2023.01)
    *H10K 50/16*     (2023.01)
    *H10K 50/17*     (2023.01)
    *H10K 59/35*     (2023.01)
    *H10K 102/00*     (2023.01)

(52) U.S. Cl.
CPC .......... *H10K 77/111* (2023.02); *G06F 1/1652* (2013.01); *G09F 9/301* (2013.01); *H05K 2201/09909* (2013.01); *H10K 50/15* (2023.02); *H10K 50/16* (2023.02); *H10K 50/17* (2023.02); *H10K 50/171* (2023.02); *H10K 59/12* (2023.02); *H10K 59/35* (2023.02); *H10K 2102/311* (2023.02)

(58) Field of Classification Search
CPC .... H10K 59/65; H10K 59/873; H10K 59/122; H10K 59/35; H10K 59/12; H10K 77/111; H10K 2102/311; G06F 1/1652; G09F 9/30; G09F 9/301; H05B 33/02; H05B 33/04; H05K 2201/09909
See application file for complete search history.

(56) References Cited

U.S. PATENT DOCUMENTS

| | | | | |
|---|---|---|---|---|
| 2017/0148856 | A1* | 5/2017 | Choi | H10K 59/873 |
| 2018/0124933 | A1* | 5/2018 | Park | H05K 13/04 |
| 2018/0151850 | A1* | 5/2018 | Lee | H10K 71/00 |
| 2019/0165312 | A1* | 5/2019 | Bae | G09G 3/20 |
| 2019/0288231 | A1* | 9/2019 | He | H10K 59/873 |
| 2020/0203660 | A1* | 6/2020 | Shi | H10K 59/873 |

FOREIGN PATENT DOCUMENTS

| | | | | | |
|---|---|---|---|---|---|
| WO | WO-2018158953 | A1 * | 9/2018 | | G09F 9/30 |
| WO | WO-2018179047 | A1 * | 10/2018 | | G09F 9/30 |
| WO | WO-2018179175 | A1 * | 10/2018 | | G09F 9/30 |
| WO | WO-2018179308 | A1 * | 10/2018 | | G09F 9/301 |
| WO | WO-2018198262 | A1 * | 11/2018 | | G09F 9/30 |
| WO | WO-2019030887 | A1 * | 2/2019 | | G09F 9/30 |

\* cited by examiner

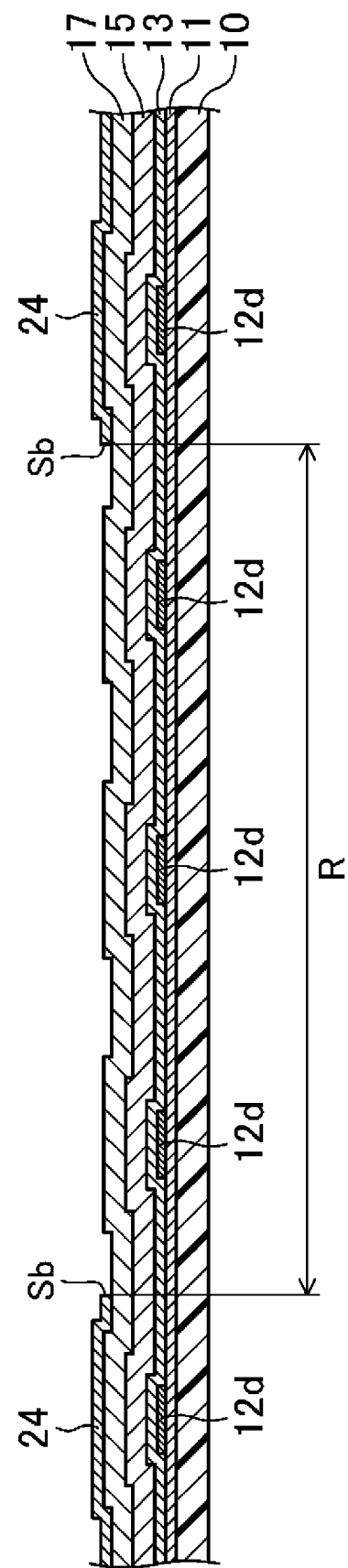

DISPLAY DEVICE INCLUDING DAM AND SEPARATION WALLS

TECHNICAL FIELD

The disclosure relates to a display device.

BACKGROUND ART

In recent years, a self-luminous type organic electroluminescence (hereinafter also referred to as EL) display device using an organic EL element has attracted attention as a display device that can replace liquid crystal display devices. Here, for example, the organic EL element includes an organic EL layer including a light-emitting layer, a first electrode disposed on one surface side of the organic EL layer, and a second electrode disposed on the other surface side of the organic EL layer.

For example, PTL 1 discloses an organic electroluminescence display panel in which an organic EL layer and a second electrode formed using a vapor deposition method are divided by a partition wall having a reverse tapered portion.

CITATION LIST

Patent Literature

PTL 1: JP 2007-250520 A

SUMMARY

Technical Problem

In an organic EL display device, for example, to dispose a camera, a fingerprint sensor, and the like inside a display region for which an image is displayed, it is necessary to provide an island-shaped non-display region and provide through-holes extending through in a thickness direction in the non-display region. However, a common function layer formed using a vapor deposition method is disposed in the display region, and thus, when the through-holes described above are provided inside the display region, there is concern that moisture and the like may flow into the display region through the common function layer exposed from the through-holes. In such a case, an organic EL layer constituting the organic EL element deteriorates, and thus it is necessary to form the common function layer separated into a display region side and a through-hole side on the periphery of the through-holes. It is technically difficult to manufacture a vapor deposition mask such that a common function layer is not formed in the through-holes inside the display region and on the periphery thereof. Here, while it is effective to use the reverse tapered structure described above in PTL 1 to form the common function layer separated into the display region side and the through-hole side, in a case where the display region side and the through-hole side are connected at a certain position in the common function layer, the organic EL layer deteriorates, which leaves room for improvement.

In light of the above points, an object of the disclosure is to form a common function layer that is reliably separated into a display region side and a through-hole side.

Solution to Problem

To achieve the object described above, according to the disclosure, there is provided a display device including: a base substrate; a thin film transistor layer disposed on the base substrate and including a first inorganic insulating film; a light-emitting element layer disposed on the thin film transistor layer and in which a plurality of light-emitting elements are arranged in correspondence with a plurality of subpixels configuring a display region; and a sealing film disposed on the light-emitting element layer to cover the light-emitting elements and in which a second inorganic insulating film, an organic insulating film, and a third inorganic insulating film are sequentially stacked, in which, a frame region is provided around the display region, a non-display region is provided in an island shape inside the display region, an external dam wall is provided in a frame shape in the frame region to surround the display region and overlap a circumferential end portion of the organic insulating film, a first electrode, a function layer, and a second electrode are sequentially stacked in each of the light-emitting elements, a through-hole extending through the base substrate in a thickness direction of the base substrate is formed in the non-display region, a separation wall is provided in a frame shape along a circumferential edge of the through-hole in the non-display region, both side surfaces of the separation wall are inclined in a reverse tapered shape in which a width between the both side surfaces gradually decreases toward the base substrate side, an internal dam wall is provided in a frame shape to overlap a circumferential end portion of the organic insulating film on the display region side of the separation wall in the non-display region, the function layer includes a common function layer provided to be common to the subpixels, a frame-like slit is provided in the common function layer to surround the separation wall on the display region side of the separation wall and to pass through the common function layer, and the first inorganic insulating film and the second inorganic insulating film are in contact with each other in the frame-like slit.

Advantageous Effects of Disclosure

According to the disclosure, the common function layer is provided with a frame-like slit surrounding a separation wall on a display region side of the separation wall and passing through the common function layer. This makes it possible to form the common function layer being reliably separated into a display region side and a through-hole side.

BRIEF DESCRIPTION OF DRAWINGS

FIG. 16 is a cross-sectional view of the irradiation region of laser light that is taken along line XVI-XVI illustrated in FIG. 15.

DESCRIPTION OF EMBODIMENTS

Embodiments of the disclosure will be described below in detail with reference to the drawings. Note that the disclosure is not limited to each embodiment to be described below.

First Embodiment

Figure 1:
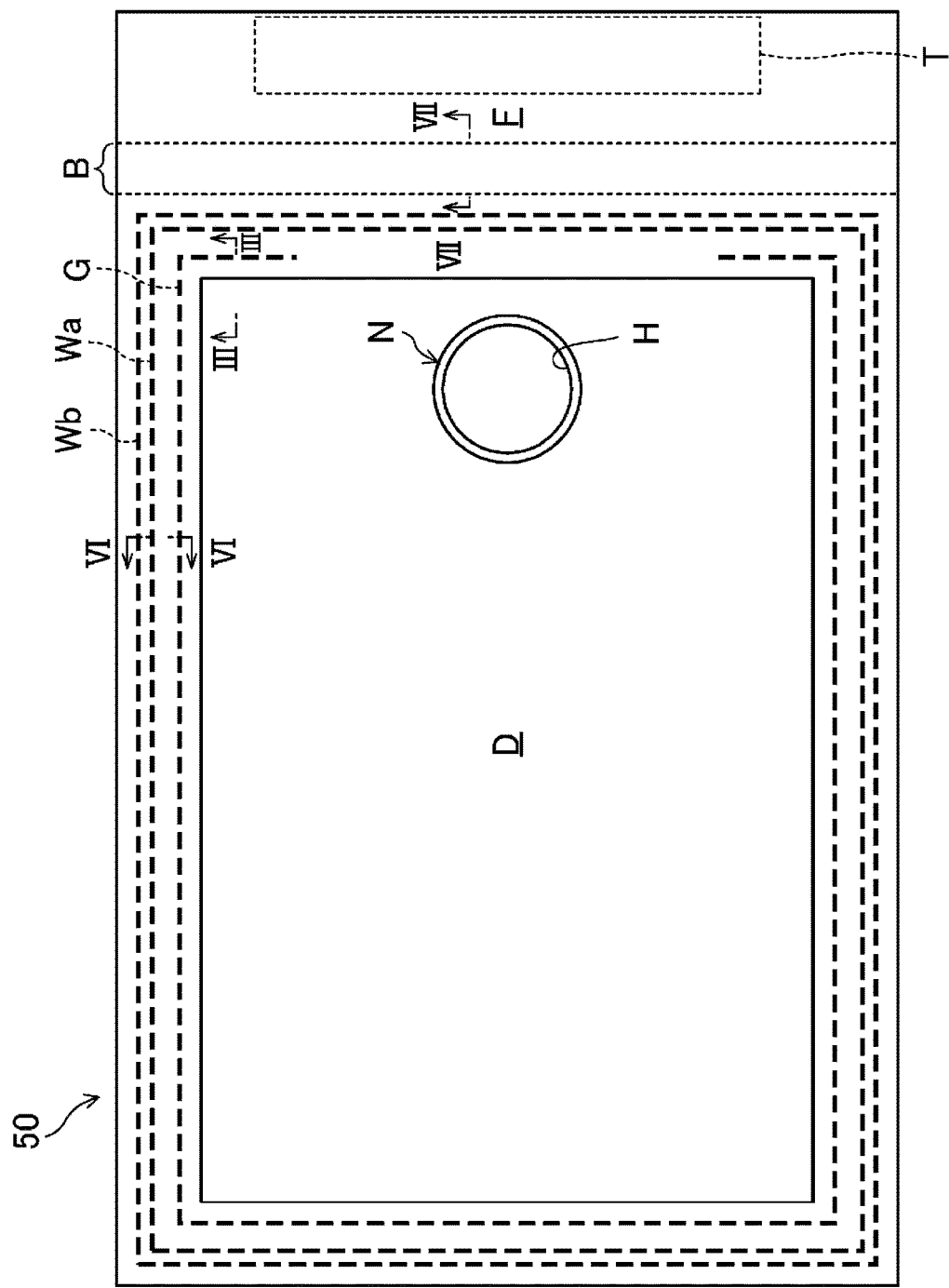
FIG. 1 is a plan view illustrating a schematic configuration of an organic EL display device according to a first embodiment of the disclosure.
Figure 2:
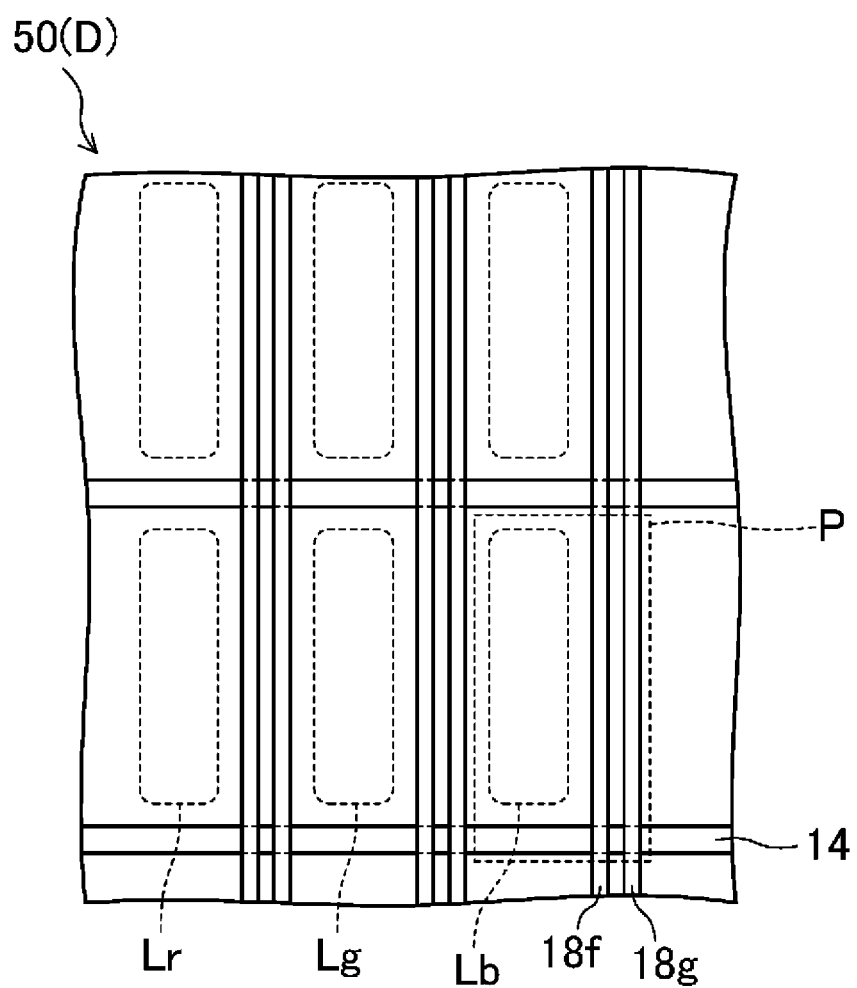
FIG. 2 is a plan view of a display region of the organic EL display device according to the first embodiment of the disclosure.
Figure 3:
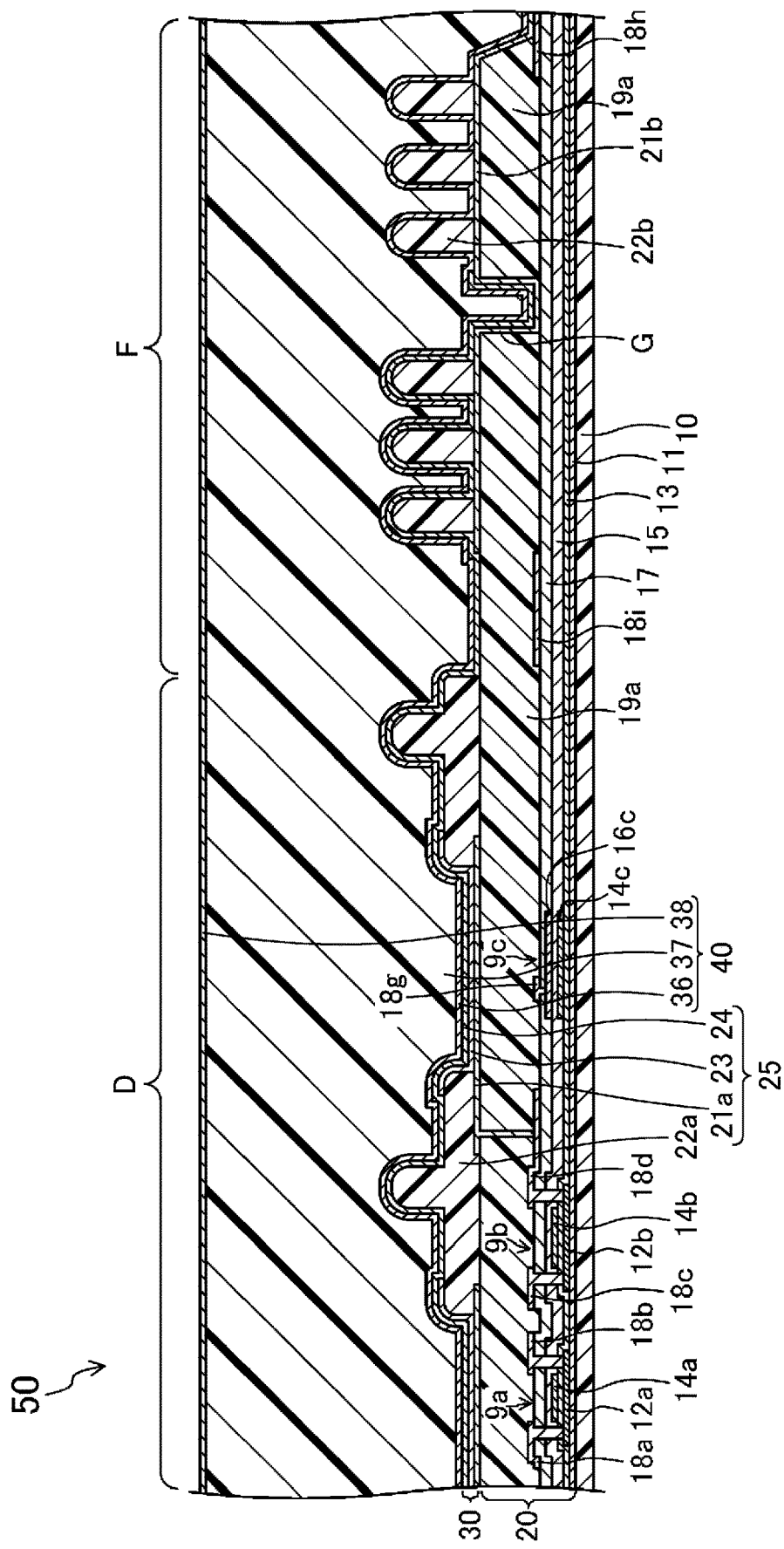
FIG. 3 is a cross-sectional view of the organic EL display device taken along a line in FIG. 1.
Figure 4:
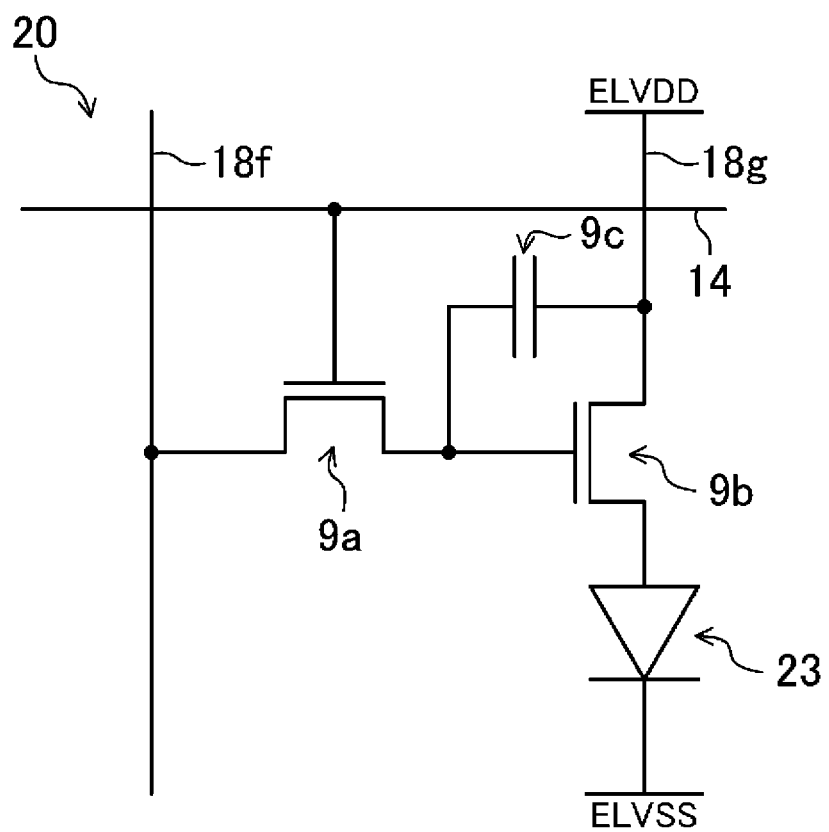
FIG. 4 is an equivalent circuit diagram of a TFT layer constituting the organic EL display device according to the first embodiment of the disclosure.
Figure 5:
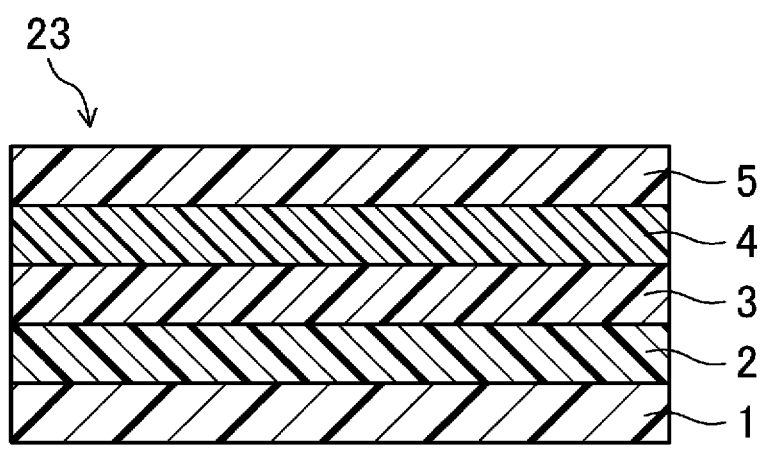
FIG. 5 is a cross-sectional view of an organic EL layer configuring the organic EL display device according to the first embodiment of the disclosure.
Figure 6:
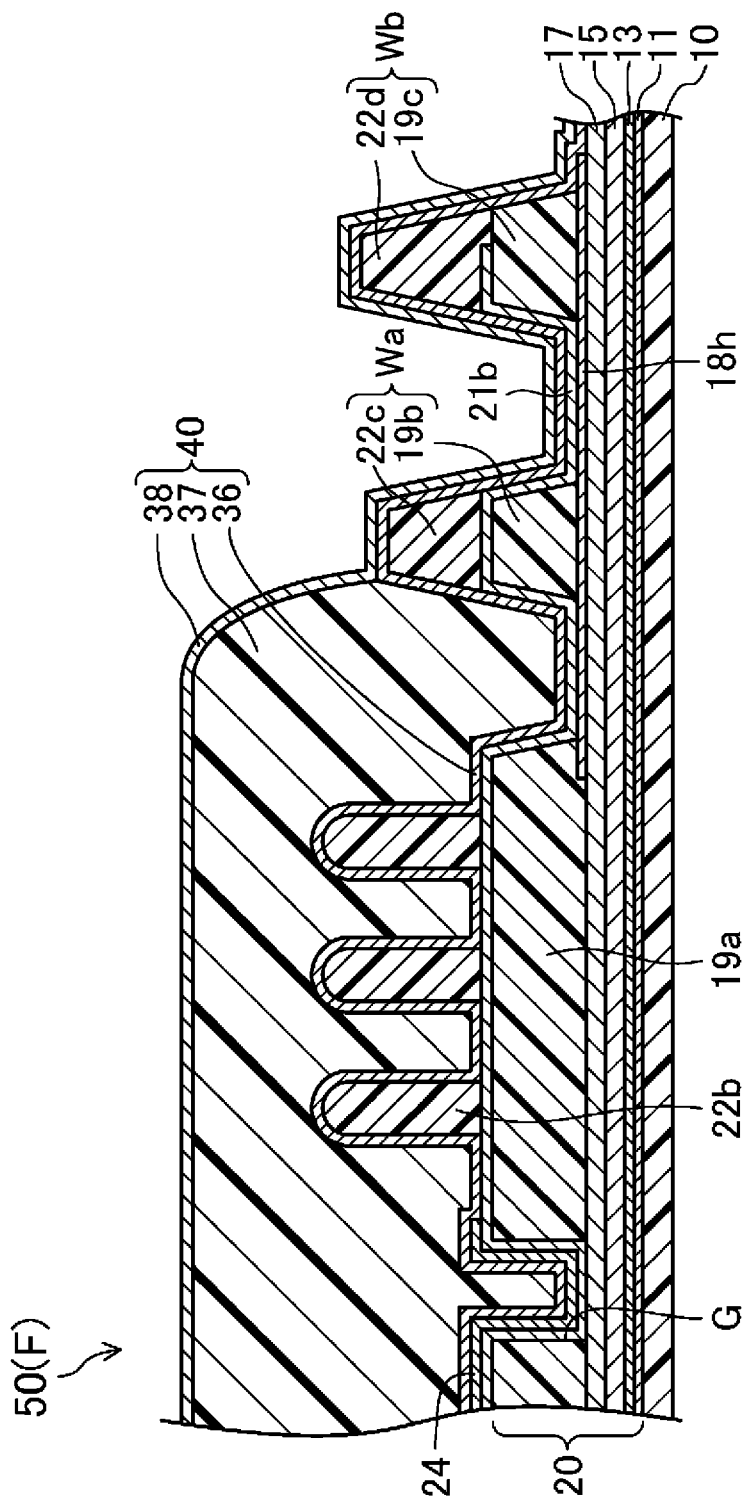
FIG. 6 is a cross-sectional view of a frame region of the organic EL display device taken along a line VI-VI in FIG. 1.
Figure 7:
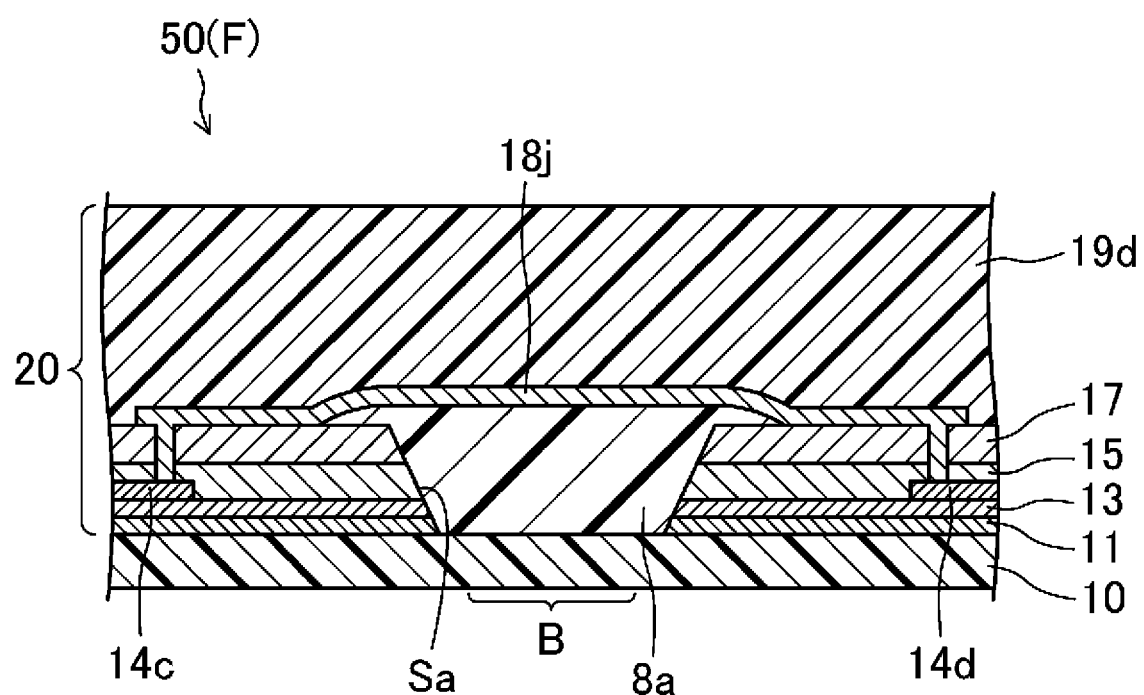
FIG. 7 is a cross-sectional view of a frame region of the organic EL display device taken along a line VII-VII in FIG. 1.
Figure 8:
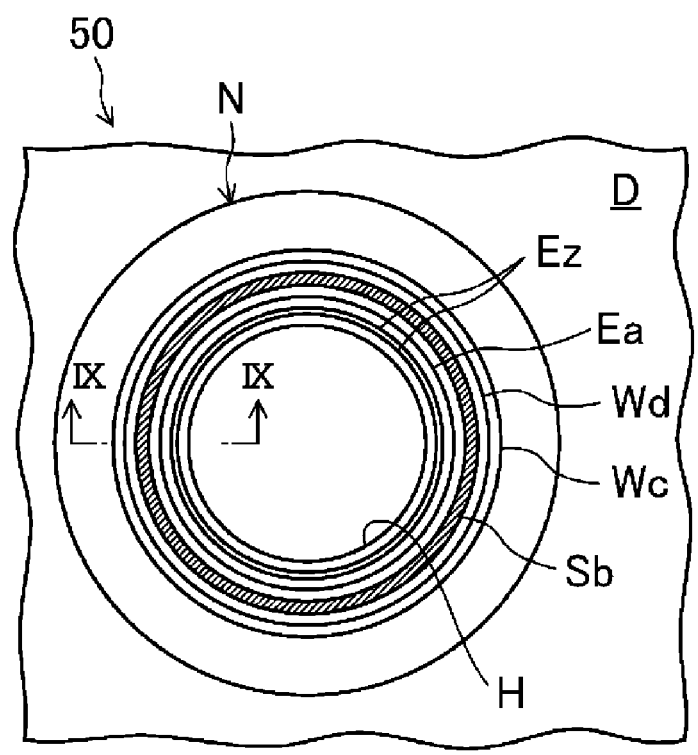
FIG. 8 is a plan view of a non-display region of the organic EL display device according to the first embodiment of the disclosure and the periphery of the non-display region.
Figure 9:
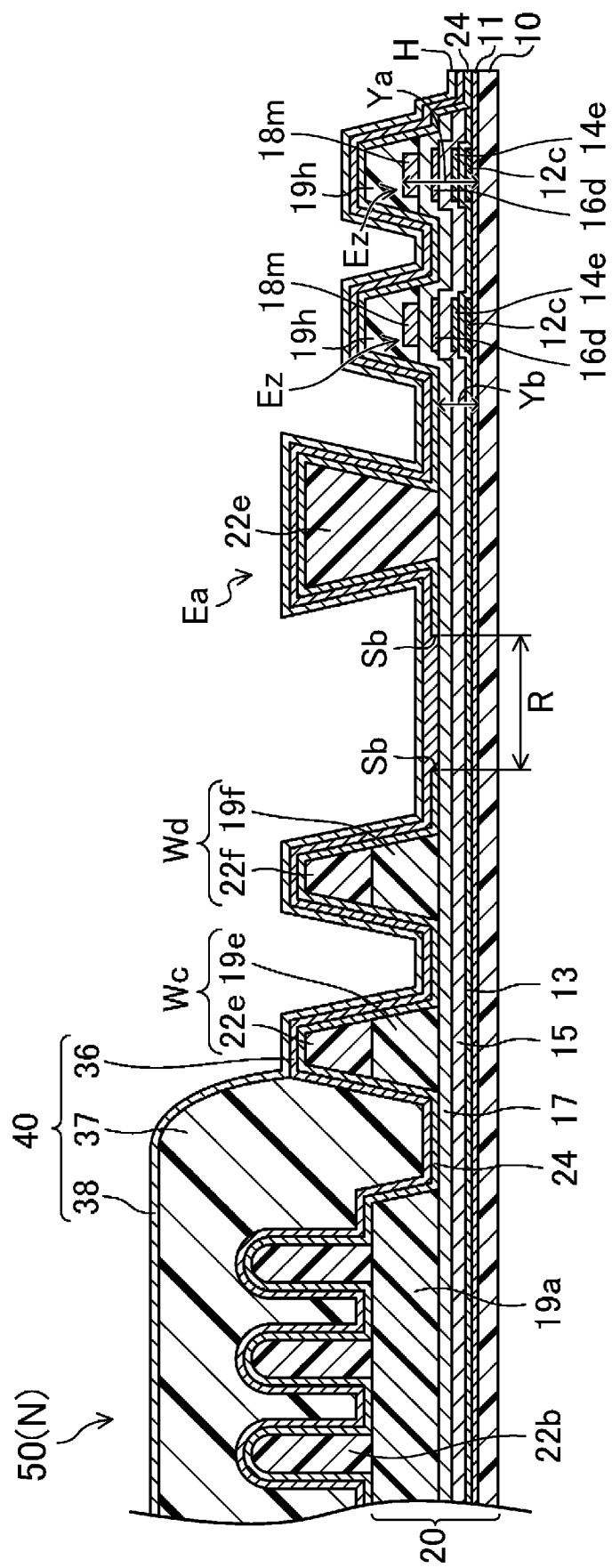
FIG. 9 is a cross-sectional view of the non-display region of the organic EL display device taken along a line IX-IX in FIG. 8.

FIG. 1 to FIG. 14 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50 according to the present embodiment. In addition, FIG. 2 is a plan view of a display region D of the organic EL display device 50. FIG. 3 is a cross-sectional view of the organic EL display device 50 taken along a line in FIG. 1. FIG. 4 is an equivalent circuit diagram of a TFT layer 20 constituting the organic EL display device 50. FIG. 5 is a cross-sectional view of an organic EL layer 23 configuring the organic EL display device 50. FIGS. 6 and 7 are cross-sectional views of a frame region F of the organic EL display device 50 taken along a line VI-VI and a line VII-VII in FIG. 1, respectively. FIG. 8 is a plan view of a non-display region N of the organic EL display device 50 and the periphery of the non-display region N. FIG. 9 is a cross-sectional view of the non-display region N of the organic EL display device 50 taken along a line IX-IX in FIG. 8.

As illustrated in FIG. 1, the organic EL display device 50 includes, for example, the display region D provided in a rectangular shape and configured to display an image and a frame region F provided in a rectangular frame-like shape on the periphery of the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, a plurality of subpixels P are arranged in a matrix shape in the display region D. In addition, in the display region D, for example, a subpixel P including a red light-emitting region Lr configured to display a red color, a subpixel P including a green light-emitting region Lg configured to display a green color, and a subpixel P including a blue light-emitting region Lb configured to display a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D. Further, as illustrated in FIG. 1, the non-display region N is provided in an island shape inside the display region D. Here, as illustrated in FIG. 1, in the non-display region N, a through-hole H that extends through a resin substrate layer 10 to be described below in a thickness direction is provided, for example, in order to allow a camera, a fingerprint sensor, and the like to be disposed. Note that a detailed structure and the like of the non-display region N will be described below with reference to FIGS. 8 and 9.

A terminal portion T is provided in an end portion of the frame region F on the right side in FIG. 1 in such a manner as to extend in one direction (a vertical direction in the drawing). In addition, in the frame region F, as illustrated in FIG. 1, a bending portion B that is bendable, for example, by 180 degrees (in a U-shape) with a vertical direction in the drawing as a bending axis is provided closer to the display region D than the terminal portion T and extends in one direction (the vertical direction in the drawing). Here, in the frame region F, in a flattening film 19a to be described below, as illustrated in FIGS. 1, 3, and 6, a trench G having a substantially C shape is provided such that it extends through the flattening film 19a. Note that, as illustrated in FIG. 1, the trench G is provided in a substantially C shape such that a terminal portion T side opens in a plan view.

As illustrated in FIGS. 3, 6, 7, and 9, the organic EL display device 50 includes a resin substrate layer 10 provided as a base substrate, a thin film transistor (hereinafter, also referred to as a TFT) layer 20 provided on the resin substrate layer 10, an organic EL element layer 30 provided as a light-emitting element layer on the TFT layer 20, and a sealing film 40 provided on the organic EL element layer 30.

The resin substrate layer 10 is formed, for example, of a polyimide resin or the like.

As illustrated in FIG. 3, the TFT layer 20 includes a base coat film 11 provided on the resin substrate layer 10 as a first inorganic insulating film, a plurality of first TFTs 9a, a plurality of second TFTs 9b, and a plurality of capacitors 9c provided on the base coat film 11, and the flattening film 19a provided on each of the first TFTs 9a, each of the second TFTs 9b, and each of the capacitors 9c. Here, in the TFT layer 20, as illustrated in FIG. 2 and FIG. 4, a plurality of gate lines 14 are provided so as to extend parallel to each other in the lateral direction in the drawings. Further, in the TFT layer 20, as illustrated in FIG. 2 and FIG. 4, a plurality of source lines 18f are provided so as to extend parallel to each other in the vertical direction in the drawings. Further, in the TFT layer 20, as illustrated in FIG. 2 and FIG. 4, a plurality of power source lines 18g are provided so as to extend parallel to each other in the vertical direction in the drawings. Then, as illustrated in FIG. 2, each of the power source lines 18g is provided to be adjacent to one of the source lines 18f. Further, in the TFT layer 20, as illustrated in FIG. 4, the first TFT 9a, the second TFT 9b, and the capacitor 9c are disposed for each of the subpixels P.

The base coat film 11 is formed of a single-layer film or a layered film of an inorganic insulating film made of, for example, silicon nitride, silicon oxide, silicon oxynitride, or the like.

The first TFT 9a is electrically connected to the corresponding gate line 14 and source line 18f in each of the subpixels P, as illustrated in FIG. 4. Additionally, as illustrated in FIG. 3, the first TFT 9a includes a semiconductor layer 12a, a gate insulating film 13, a gate electrode 14a, a first interlayer insulating film 15, a second interlayer insulating film 17, and a source electrode 18a and a drain electrode 18b, which are provided in this order on the base coat film 11. As illustrated in FIG. 3, the semiconductor layer 12a, for example, is provided in an island shape on the base coat film 11 using a low-temperature polysilicon film and includes a channel region, a source region, and a drain region. In addition, as illustrated in FIG. 3, the gate insulating film 13 is provided as a first inorganic insulating film such that it covers the semiconductor layer 12a. Additionally, as illustrated in FIG. 3, the gate electrode 14a is provided on the gate insulating film 13 such that it overlaps with the channel region of the semiconductor layer 12a. Additionally, as illustrated in FIG. 3, the first interlayer insulating film 15 and the second interlayer insulating film 17 are provided in this order as a first inorganic insulating film to cover the gate electrode 14a. Additionally, as illustrated in FIG. 3, the source electrode 18a and the drain electrode 18b are separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17. Note that the gate insulating film 13, the first interlayer insulating film 15, and the second interlayer insulating film 17 are each constituted of a single-layer film or a layered film of an inorganic insulating film such as silicon nitride, silicon oxide, or silicon oxynitride.

The second TFT 9b is electrically connected to the corresponding first TFT 9a and power source line 18g in each of the subpixels P, as illustrated in FIG. 4. As illustrated in FIG. 3, the second TFT 9b includes a semiconductor layer 12b, the gate insulating film 13, a gate electrode 14b, the first interlayer insulating film 15, the second interlayer insulating film 17, and a source electrode 18c and a drain electrode 18d, which are provided in this order on the base coat film 11. Here, as illustrated in FIG. 3, the semiconductor layer 12b is provided in an island shape on the base coat film 11, for example, using a low-temperature polysilicon film and includes a channel region, a source region, and a drain region. Additionally, as illustrated in FIG. 3, the gate insulating film 13 is provided covering the semiconductor layer 12b. Additionally, as illustrated in FIG. 3, the gate electrode 14b is provided on the gate insulating film 13, and overlaps with the channel region of the semiconductor layer 12b. Additionally, as illustrated in FIG. 3, the first interlayer insulating film 15 and the second interlayer insulating film 17 are provided in this order to cover the gate electrode 14b. Additionally, as illustrated in FIG. 3, the source electrode 18c and the drain electrode 18d are separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that in the present embodiment, the first TFT 9a and the second TFT 9b are exemplified as being of a top-gate type, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes a lower conductive layer 14c formed of the same material as and in the same layer as the gate electrodes 14a and 14b, the first interlayer insulating film 15 provided covering the lower conductive layer 14c, and an upper conductive layer 16c disposed on the first interlayer insulating film 15 overlapping the lower conductive layer 14c. Note that as illustrated in FIG. 3, the upper conductive layer 16c is electrically connected to the power source line 18g via a contact hole formed in the second interlayer insulating film 17.

The flattening film 19a is, for example, formed of a positive photosensitive resin such as a polyimide resin.

As illustrated in FIG. 3, the organic EL element layer 30 includes a plurality of organic EL elements 25 provided as a plurality of light-emitting elements to be arranged in a matrix on the flattening film 19a.

As illustrated in FIG. 3, the organic EL element 25 includes the first electrode 21a provided on the flattening film 19a, an organic EL layer 23 provided on the first electrode 21a as a function layer, and a second electrode 24 provided on the organic EL layer 23 to be common to the plurality of subpixels P.

As illustrated in FIG. 3, the first electrode 21a is electrically connected to the drain electrode 18d of the second TFT 9b of each subpixel P via a contact hole formed in the flattening film 19a. The first electrode 21a functions to inject holes (positive holes) into the organic EL layer 23. The first electrode 21a is preferably formed of a material having a large work function to improve the efficiency of hole injection into the organic EL layer 23. Examples of materials constituting the first electrode 21a include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a also include an alloy such as astatine (At)/astatine oxide ($AtO_2$). Furthermore, examples of materials constituting the first electrode 21a include electrically conductive oxides such as tin oxide (SnO), zinc oxide (ZnO), indium tin oxide (ITO), and indium zinc oxide (IZO). The first electrode 21a may also be formed by layering a plurality of layers formed of any of the materials described above. Note that, examples of compound materials having a large work function include indium tin oxide (ITO) and indium zinc oxide (IZO). Furthermore, the peripheral end portion of the first electrode 21a is covered with an edge cover 22a provided in a lattice shape common to the plurality of subpixels p. Examples of a material constituting the edge cover 22a include a positive photosensitive resin such as a polyimide resin, acrylic resin, polysiloxane resin, and novolak resin. Further, as illustrated in FIG. 3, part of a surface of the edge cover 22a projects upward in the drawing and is a pixel photo spacer provided in an island shape.

As illustrated in FIG. 5, each organic EL layer 23 includes a hole injection layer 1, a hole transport layer 2, a light-emitting layer 3, an electron transport layer 4, and an electron injection layer 5, which are provided in that order on a first electrode 21a.

The hole injection layer 1 is also referred to as an anode buffer layer, has a function of bringing energy levels of the first electrode 21a and the organic EL layer 23 close to each other to improve hole injection efficiency from the first electrode 21a into the organic EL layer 23, and is provided as a common function layer that is common to the plurality of subpixels P. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like. The common function layer is a function layer that is formed using a common metal mask (CMM). This CMM is a mask in which one opening is provided in correspondence with one display device, and thus a pattern that shields an area corresponding to the through-hole H cannot be provided. For this reason, in a CMM mask, a common function layer is also deposited on an area corresponding to the through-hole H. In contrast to this, an individual function layer is a function layer that is formed using a fine metal mask (FMM). This FMM is a mask in which an opening is provided for each color (for example, a function layer that is common to red and green is also included). Furthermore, in addition to the hole injection layer described above, the function layer includes the hole transport layer 2, the light-emitting layer 3, the electron transport layer 4, the electron injection layer 5, a blocking layer, a cap layer, and the like.

The hole transport layer 2 has a function of improving the hole transport efficiency from the first electrode 21a to the organic EL layer 23 and is provided as a common function layer that is common to the plurality of subpixels P. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region where positive holes and electrons are injected from the first electrode 21a and the second electrode 24, respectively, and the holes and the electrons recombine, when a voltage is applied via the first electrode 21a and the second electrode 24. Here, the light-emitting layer 3 is formed of a material having high light-emitting efficiency. Moreover, examples of materials constituting the light-emitting layer 3 include metal oxynoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of efficiently moving electrons to the light-emitting layer 3 and is provided as a common function layer that is common to the plurality of subpixels P. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxynoid compounds, and the like, as organic compounds.

The electron injection layer 5 has a function of bringing energy levels of the second electrode 24 and the organic EL layer 23 close to each other to improve the efficiency of electron injection into the organic EL layer 23 from the second electrode 24, and this function allows the drive voltage of the organic EL element 25 to be lowered. The electron injection layer 5 is also referred to as a cathode buffer layer, and is provided as a common function layer that is common to the plurality of subpixels P. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO), and the like.

The common function layer described above is an example, and any one of the layers may be the individual function layer described above. For example, in a case where a display device is configured by performing color conversion of ultraviolet light or blue light emitted from the light-emitting layer using a Quantum-dot light emitting diode (QLED) or the like, the light-emitting layer may be a common function layer.

As illustrated in FIG. 3, the second electrode 24 is provided covering each of the organic EL layers 23 and the edge cover 22a. In addition, the second electrode 24 has a function of injecting electrons into the organic EL layer 23. In addition, the second electrode 24 is preferably formed of a material with a low work function to improve the efficiency of electron injection into the organic EL layer 23. Here, examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of an electrically conductive oxide such as tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

As illustrated in FIGS. 3, 6, and 9, the sealing film 40 includes a second inorganic insulating film 36 disposed to cover each organic EL element 25 by covering the second electrode 24, an organic insulating film 37 disposed on the second inorganic insulating film 36, and a third inorganic insulating film 38 disposed to cover the organic insulating film 37, and has a function of protecting the organic EL layer 23 from moisture, oxygen, and the like. Here, the second inorganic insulating film 36 and the third inorganic insulating film 38, for example, are formed of an inorganic material such as silicon oxide ($SiO_2$), aluminum oxide ($Al_2O_3$), silicon nitride (SiNx (here, x is a positive number)) such as trisilicon tetranitride ($Si_3N_4$), or silicon carbonitride (SiCN). Further, the organic insulating film 37 is formed of, for example, an organic material such as an acrylic resin, polyurea resin, parylene resin, polyimide resin, and polyamide resin.

Additionally, as illustrated in FIG. 1, the organic EL display device 50 includes a first external dam wall Wa disposed in a frame-like shape so as to surround the display region D and overlap an outer circumferential end portion of the organic insulating film 37 in the frame region F, and a second external dam wall Wb disposed in a frame-like shape so as to surround the first external dam wall Wa.

As illustrated in FIG. 6, the first external dam wall Wa includes a first lower resin layer 19b formed of the same material as that of the flattening film 19a in the same layer and a first upper resin layer 22c that is provided above the first lower resin layer 19b with the first conductive layer 21b therebetween and is formed of the same material as that of the edge cover 22a in the same layer. As illustrated in FIG. 6, the first conductive layer 21b is provided in a substantially C shape in such a manner as to overlap with the trench G, the first external dam wall Wa, and the second external dam wall Wb in the frame region F. Note that the second conductive layer 21b is formed of the same material and in the same layer as the first electrode 21a.

As illustrated in FIG. 6, the second external dam wall Wb includes a second lower resin layer 19c formed of the same material as that of the flattening film 19a in the same layer and a second upper resin layer 22d that is provided above the second lower resin layer 19c with the first conductive layer 21b therebetween and is formed of the same material as that of the edge cover 22a in the same layer.

As illustrated in FIGS. 3 and 6, the organic EL display device 50 includes a first frame wiring line 18 h provided in a substantially C shape on the outer side of the trench G in such a manner as to surround the display region D and overlap with the first external dam wall Wa and the second external dam wall Wb in the frame region F. Here, the first frame wiring line 18 h is electrically connected to a power source terminal to which a low power supply voltage (ELVSS) is input in the terminal portion T. Further, as illustrated in FIG. 6, the first frame wiring line 18 h is electrically connected to the second electrode 24 via the second conductive layer 21b.

As illustrated in FIG. 3, the organic EL display device 50 includes a second frame wiring line 18i provided in a substantially C shape on the inner side of the trench G in the frame region F. Here, the second frame wiring line 18i is electrically connected to a power source terminal to which a high power supply voltage (ELVDD) is input in the terminal portion T. The second frame wiring line 18i is electrically connected, on the display region D side, to the plurality of power source lines 18g disposed in the display region D.

As illustrated in FIG. 7, the organic EL display device 50 includes, at the bending portion B, a lower layer flattening film 8a disposed to fill in a line-like slit Sa formed in the base coat film 11, the gate insulating film 13, the first interlayer insulating film 15, and the second interlayer insulating film 17, a plurality of lead wiring lines 18j disposed on the lower layer flattening film 8a and the second interlayer insulating film 17, and a wiring line coating layer 19d disposed to cover the lead wiring lines 18j.

As illustrated in FIG. 7, the line-like slit Sa is provided as a groove shape that passes through the base coat film 11, the gate insulating film 13, the first interlayer insulating film 15 and the second interlayer insulating film 17 and runs along a direction in which the bending portion B extends so as to expose the surface of the resin substrate layer 10.

The lower layer flattening film 8a is formed of, for example, an organic resin material such as a polyimide resin.

The plurality of lead wiring lines 18j are provided extending parallel to each other in a direction orthogonal to the direction in which the bending portion B extends. Here, as illustrated in FIG. 7, both end portions of each of the lead wiring lines 18j are electrically connected to the first gate conductive layer 14c and the second gate conductive layer 14d via each contact hole formed in a layered film of the first interlayer insulating film 15 and the second interlayer insulating film 17. Note that the lead wiring lines 18j are formed of the same material as that of the source line 18f and the power source line 18g in the same layer. Further, as illustrated in FIG. 7, the first gate conductive layer 14c is provided between the gate insulating film 13 and the first interlayer insulating film 15 and is electrically connected to signal wiring lines (the gate line 14, the source line 18f, and the like) extending toward the display region D. Further, as illustrated in FIG. 7, the second gate conductive layer 14d is provided between the gate insulating film 13 and the first interlayer insulating film 15 and, for example, is electrically connected to a signal terminal of the terminal portion T. The wiring line covering layer 19d is formed of the same material as that of the flattening film 19a in the same layer.

As illustrated in FIGS. 3, 6, and 9, the organic EL display device 50 includes a plurality of peripheral photo spacers 22b each provided in an island shape so as to protrude upward in the drawing on the flattening film 19a in the frame region F and the non-display region N. Each peripheral photo spacer 22b is formed of the same material and in the same layer as the edge cover 22a. The peripheral photospacer may be formed by stacking a resin layer formed of the same material as that of the edge cover 22a in the same layer and another resin layer. In a case where the pixel photospacer and the peripheral photospacer are formed in a layer different from the edge cover 22a, the photospacer of this different layer is also included in the edge cover described in the present embodiment.

As illustrated in FIGS. 8 and 9, the organic EL display device 50 includes a separation wall Ea provided in a frame-like shape along a peripheral edge of the through-hole H in the non-display region N.

As illustrated in FIG. 9, the separation wall Ea is provided in a frame-like shape on the second interlayer insulating film 17 and includes a resin layer 22e formed of the same material as that of the edge cover 22a in the same layer. Here, as illustrated in FIG. 9, both side surfaces of the separation wall Ea (the resin layer 22e) are inclined in a reverse tapered shape in which a width between both side surfaces gradually decreases toward the resin substrate layer 10. In FIG. 9, although the second electrode 24, the second inorganic insulating film 36, and the third inorganic insulating film 38 are illustrated as covering the resin layer 22e, the second electrode 24, the second inorganic insulating film 36, and the third inorganic insulating film 38 are provided to be separated or to have a relatively low density below both side surfaces of the resin layer 22e that is inclined in a reverse tapered shape. According to this configuration, even when cracks are formed in the second inorganic insulating film 36 and the third inorganic insulating film 38 on the through-hole H side, propagation of the cracks to the display region D side can be suppressed. In FIG. 9, although the hole injection layer 1, the hole transport layer 2, the electron transport layer 4, and the electron injection layer 5 are not illustrated, similar to the second electrode 24, common function layers including the hole injection layer 1, the hole transport layer 2, the electron transport layer 4, and the electron injection layer 5 are provided to be separated or to have a relatively low density below both side surfaces of the resin layer 22e.

As illustrated in FIGS. 8 and 9, the organic EL display device 50 includes a first internal dam wall Wc and a second internal dam wall Wd each provided in a frame-like shape along the periphery of the separation wall Ea on the display region D side of the separation wall Ea in the non-display region N.

As illustrated in FIG. 9, the first internal dam wall Wc includes a first lower resin layer 19e formed of the same material as that of the flattening film 19a in the same layer and a second upper resin layer 22e that is provided on the first lower resin layer 19e and is formed of the same material as that of the edge cover 22a in the same layer. Here, as illustrated in FIG. 9, the first internal dam wall Wc is disposed to overlap with the inner circumferential end portion of the organic insulating film 37 on the display region D side of the non-display region N.

As illustrated in FIG. 9, the second internal dam wall Wd includes a second lower resin layer 19f formed of the same material as that of the flattening film 19a in the same layer and a second upper resin layer 22f that is provided on the second lower resin layer 19f and is formed of the same material as that of the edge cover 22a in the same layer.

In addition, as illustrated in FIGS. 8 and 9, between the separation wall Ea and the second internal dam wall Wd, a frame-like slit Sb is provided in the second electrode 24 to surround the separation wall Ea and pass through the second electrode 24. Although the hole injection layer 1, the hole transport layer 2, the electron transport layer 4, and the electron injection layer 5 are not illustrated in FIG. 9, similar to the second electrode 24, the frame-like slit Sb is provided to surround the separation wall Ea and to pass through the common function layers in the common function layers including the hole injection layer 1, the hole transport layer 2, the electron transport layer 4, and the electron injection layer 5. Here, in the frame-like slit Sb, as illustrated in FIG. 9, the second interlayer insulating film 17 of the TFT layer 20 and the second inorganic insulating film 36 of the sealing film 40 are in contact with each other. According to this configuration, sealing performance of the sealing film 40 can be improved, and thus the reliability can be improved. In addition, as described below, the frame-like slit Sb is formed to have a narrow width (for example, about 500 µm) by scattering the hole injection layer 1, the hole transport layer 2, the electron transport layer 4, the electron injection layer 5, and the second electrode 24 deposited using a CMM mask by emitting laser light. Therefore, excessive scattering of the hole injection layer 1, the hole transport layer 2, the electron transport layer 4, the electron injection layer 5, and the second electrode 24 can be suppressed. Furthermore, the second internal dam wall Wd and the separation wall Ea are disposed on both sides of the frame-like slit Sb. Therefore, even when the hole injection layer 1, the hole transport layer 2, the electron transport layer 4, the electron injection layer 5, and the second electrode 24 are scattered, scattering matter thereof adheres to the surfaces of the second internal dam wall Wd and the separation wall Ea, whereby scattering thereof to the display region D can be suppressed.

In addition, as illustrated in FIG. 9, the organic EL display device 50 includes one pair of layered thick film portions Ez provided in a frame-like shape along a peripheral edge of the through-hole H between the separation wall Ea and the through-hole H in the non-display region N.

As illustrated in FIG. 9, the layered thick film portion Ez includes a base coat film 11, a thick film semiconductor layer 12c, a gate insulating film 13, a thick film gate metal layer 14e, a first interlayer insulating film 15, a thick film middle metal layer 16d, a second interlayer insulating film 17, and a thick film source metal layer 18m that are provided in this order on the resin substrate layer 10 as a plurality of inorganic films. Here, a total thickness Ya of the plurality of inorganic films (the base coat film 11 to the thick film source metal layer 18m) in the layered thick film portion Ez is larger than a total thickness Yb of the plurality of inorganic films (the base coat film 11 to the second interlayer insulating film 17) between the layered thick film portion Ez and the separation wall Ea. The acoustic compliances (volume/(density×sound velocity$^2$)) of the plurality of inorganic films are in the same level, and thus, by providing the layered thick film portion Ez having a larger film thickness on the display region D side than on the through-hole H side, propagation of cracks can be suppressed. As illustrated in FIG. 9, a thick film resin layer 19 h formed of the same material as that of the flattening film 19a in the same layer is provided between the layered thick film portion Ez and the sealing film 40 (the second inorganic insulating film 36). According to this configuration, the thick film resin layer 19 h is interposed between the TFT layer 20 and the sealing film 40, and thus, physical shocks can be absorbed.

As illustrated in FIG. 9, the gate insulating film 13, the first interlayer insulating film 15, and the second interlayer insulating film 17 are provided so as not to reach the end surface of the through-hole H in the non-display region N. Here, to inhibit cracks that propagate in an inorganic film, the semiconductor layer and the inorganic insulating film in which cracks may easily occur may be formed thinner in the peripheral portion of the through-hole H.

The organic EL display device 50 described above is configured such that, in each subpixel P, when a gate signal is input to the first TFT 9a via the gate line 14 to cause the first TFT 9a to be in the on state, a data signal is written to the gate electrode 14b of the second TFT 9b and the capacitor 9c via the source line 18f, and a current from the power source line 18g corresponding to the gate voltage of the second TFT 9b is supplied to the organic EL layer 23, the light-emitting layer 3 of the organic EL layer 23 emits light to display an image. Note that, in the organic EL display device 50, because even when the first TFT 9a is turned off, the gate voltage of the second TFT 9b is held by the capacitor 9c, the light-emitting layer 3 is kept emitting light until a gate signal of the next frame is input.

Next, a method for manufacturing the organic EL display device 50 according to the present embodiment will be described. Here, the method for manufacturing the organic EL display device 50 according to the present embodiment includes a TFT layer forming step, an organic EL element layer forming step, a sealing film forming step, a flexibilization step, and a through-hole forming step.

TFT Layer Forming Step

For example, the TFT layer 20 is formed by forming the base coat film 11, the first TFT 9a, the second TFT 9b, the capacitor 9c, and the flattening film 19a on a surface of the resin substrate layer 10 formed on a glass substrate by using a known method.

Organic EL Element Layer Forming Step

The organic EL element 25 is formed by forming the first electrode 21a, the edge cover 22a, the organic EL layer 23 (the hole injection layer 1, the hole transport layer 2, the light-emitting layer 3, the electron transport layer 4, and the electron injection layer 5), and the second electrode 24 on the flattening film 19a of the TFT layer 20 formed in the TFT layer forming step described above by using a known method, whereby the organic EL element layer 30 is formed.

Here, when the edge cover 22a is formed, in the non-display region N, after the separation wall Ea (the resin layer 22e) is formed and the organic EL layer 23 and the second electrode 24 are formed using a vapor deposition method, the hole injection layer 1, the hole transport layer 2, the electron transport layer 4, the electron injection layer 5, and the second electrode 24 formed in the irradiation region R are scattered by emitting laser light, for example, using an yttrium aluminum garnet (YAG) laser to the irradiation region R (see FIG. 9) between the second internal dam wall Wd and the separation wall Ea, whereby the frame-like slit Sb is formed.

Sealing Film Forming Step

First, on a substrate surface in which the organic EL element layer 30 was formed in the organic EL element layer forming step described above, an inorganic insulating film such as a silicon nitride film, a silicon oxide film, or a silicon oxynitride film is formed using a mask by using a plasma chemical vapor deposition (CVD) method, whereby the second inorganic insulating film 36 is formed.

Next, on the substrate surface where the second inorganic insulating film 36 is formed, a film of an organic resin material such as an acrylic resin is formed, for example, by using an ink-jet method, whereby an organic insulating film 37 is formed.

Further, for example, an inorganic insulating film such as a silicon nitride film, a silicon oxide film, or a silicon oxynitride film is formed using a mask by a plasma CVD method on the substrate where the organic insulating film 37 is formed to form a third inorganic insulating film 38, whereby a sealing film 40 is formed.

Flexibilization Step

After a protective sheet (not illustrated) is bonded to the substrate surface on which the sealing film 40 is formed through the sealing film forming step, by emitting laser light from the glass substrate side of the resin substrate layer 10, the glass substrate is peeled off from a lower face of the resin substrate layer 10, and then, a protective sheet (not illustrated) is bonded to the lower surface of the resin substrate layer 10 from which the glass substrate has been peeled off.

Through-Hole Forming Step

For example, laser light is emitted using a YAG laser to an inner circumferential-side area of the inner layered thick film portion Ez in one pair of layered thick film portions Ez provided in a frame shape (circumferential shape) on the resin substrate layer 10, from which the glass substrate has been peeled off in the flexibilization step while scanning in a circular shape, to thereby form a through-hole H.

The organic EL display device 50 of the present embodiment can be manufactured in the manner described above.

Here, in the present embodiment, although the organic EL display device 50 in which the separation wall Ea is provided in the non-display region N has been illustrated, an organic EL display device in which separation walls Eb to Ef are provided in place of the separation wall Ea may be used. Hereinafter, first to fifth modification examples using the separation walls Eb to Ef described above will be described.

First Modification Example

Figure 10:
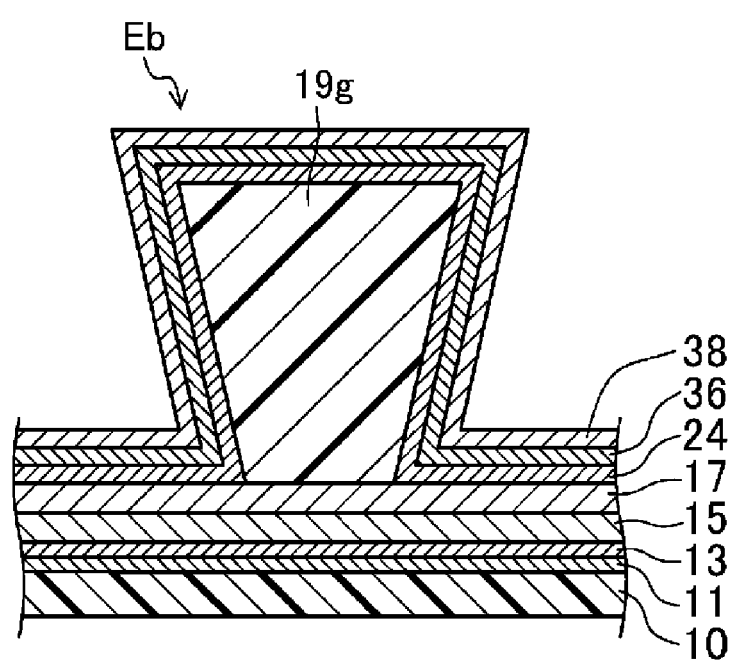
FIG. 10 is a cross-sectional view of a first modification example of a separation wall configuring the organic EL display device according to the first embodiment of the disclosure.

FIG. 10 is a cross-sectional view of a separation wall Eb that is a first modification example of the separation wall Ea. In the following modification examples, parts identical to those in FIGS. 1 to 9 are denoted by the same reference signs, and detailed descriptions thereof will be omitted.

As illustrated in FIG. 10, the separation wall Eb includes a resin layer 19g provided in a frame shape on the second interlayer insulating film 17.

The resin layer 19g is formed of the same material as that of the flattening film 19a in the same layer and is formed at the same time as when the flattening film 19a is formed in the TFT layer forming step described above. Here, as illustrated in FIG. 10, both side surfaces of the resin layer 19g are inclined in a reverse tapered shape in which the width between both side surfaces gradually decreases toward the resin substrate layer 10. In FIG. 10, while the second electrode 24, the second inorganic insulating film 36, and the third inorganic insulating film 38 are illustrated as covering the resin layer 19 g, (the common function layer,) the second electrode 24, the second inorganic insulating film 36, and the third inorganic insulating film 38 are provided to be separated or to have a relatively low density below both side surfaces of the resin layer 19g inclined in a reverse tapered shape.

According to the organic EL display device provided with the separation wall Eb having the configuration described above, by not only using the edge cover 22a as in the present embodiment but also using the flattening film 19a, the separation wall Eb that improves reliability can be formed.

Second Modification Example

Figure 11:
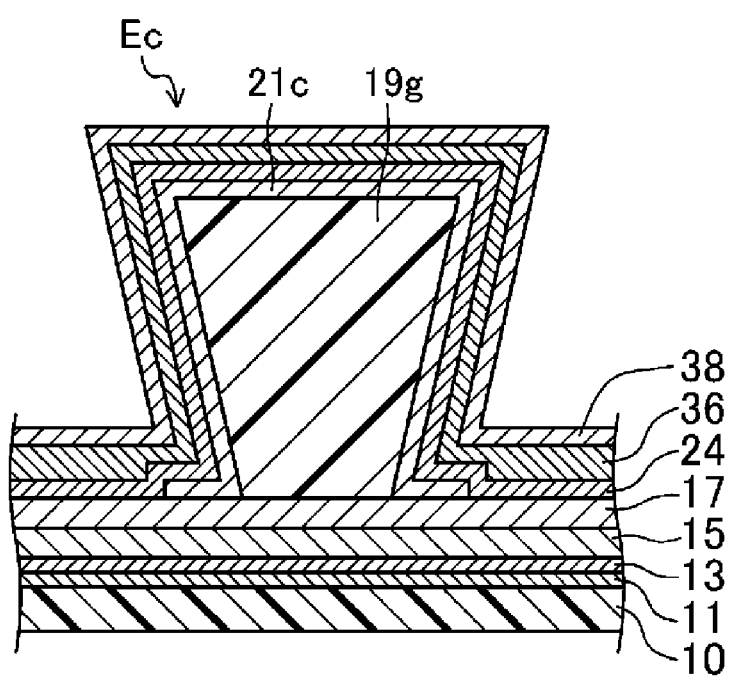
FIG. 11 is a cross-sectional view of a second modification example of a separation wall configuring the organic EL display device according to the first embodiment of the disclosure.

FIG. 11 is a cross-sectional view of a separation wall Ec that is a second modification example of the separation wall Ea.

As illustrated in FIG. 11, the separation wall Ec includes the resin layer 19g provided in a frame shape on the second interlayer insulating film 17 and a metal layer 21c disposed to cover the resin layer 19g. In FIG. 11, while the second electrode 24, the second inorganic insulating film 36, and the third inorganic insulating film 38 are illustrated as covering the resin layer 19g via the metal layer 21c, (the common function layer,) the second electrode 24, the second inorganic insulating film 36, and the third inorganic insulating film 38 are provided to be separated or to have a relatively low density below both side surfaces of the resin layer 19g inclined in a reverse tapered shape.

The metal layer 21c is formed of the same material as that of the first electrode 21a in the same layer and is formed at the same time as when the first electrode 21a is formed in the organic EL element layer forming step described above.

According to the organic EL display device including the separation wall Ec having the configuration described above, the surface of the separation wall Ec is reinforced by the metal layer 21c disposed to cover the resin layer 19 g, and thus damage and peeling of the separation wall Ec can be inhibited.

Third Modification Example

Figure 12:
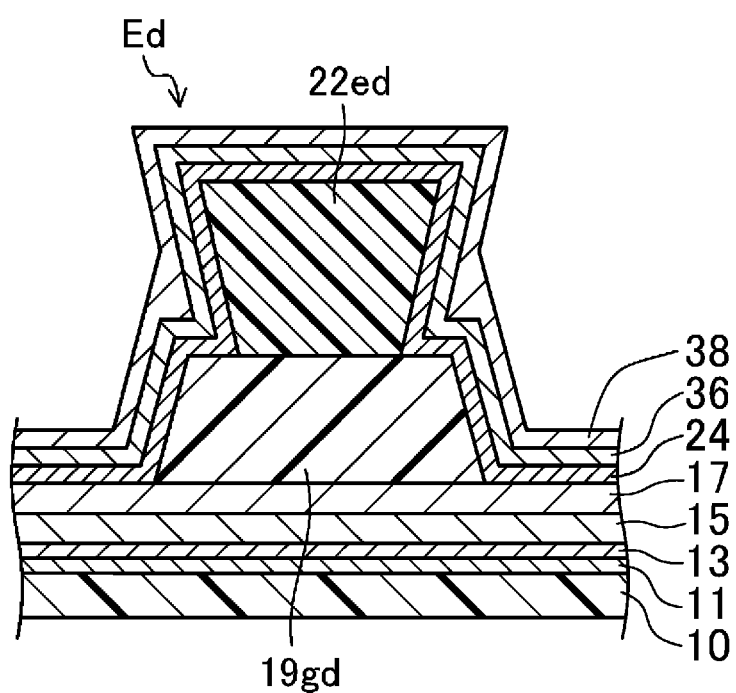
FIG. 12 is a cross-sectional view of a third modification example of a separation wall configuring the organic EL display device according to the first embodiment of the disclosure.

FIG. 12 is a cross-sectional view of a separation wall Ed that is a third modification example of the separation wall Ea.

As illustrated in FIG. 12, the separation wall Ed includes a lower-layer resin layer 19gd provided in a frame shape on the second interlayer insulating film 17 and an upper-layer resin layer 22ed provided on the lower-layer resin layer 19gd.

The lower-layer resin layer 19gd is formed of the same material as that of the flattening film 19a in the same layer and is formed at the same time as when the flattening film 19a is formed in the TFT layer forming step.

The upper-layer resin layer 22ed is formed of the same material as that of the edge cover 22a in the same layer and is formed at the same time as when the edge cover 22a is formed in the organic EL element layer forming step described above. Here, as illustrated in FIG. 12, both side surfaces of the upper-layer resin layer 22ed are inclined in a reverse tapered shape in which a width between both side surfaces gradually decreases toward the resin substrate layer 10. In FIG. 12, while the second electrode 24, the second inorganic insulating film 36, and the third inorganic insulating film 38 are illustrated as covering the upper-layer resin layer 22ed, (the common function layer,) the second electrode 24, the second inorganic insulating film 36, and the third inorganic insulating film 38 are provided to be separated or to have a relatively low density below both side surfaces of the upper-layer resin layer 22ed inclined in a reverse tapered shape.

According to the organic EL display device including the separation wall Ed having the configuration described above, paths from the second inorganic insulating film 36 and the third inorganic insulating film 38 to the display region D are long, and thus propagation of cracks in the second inorganic insulating film 36 and the third inorganic insulating film 38 can be inhibited, whereby the separation wall Ed that improves reliability can be formed.

Fourth Modification Example

Figure 13:
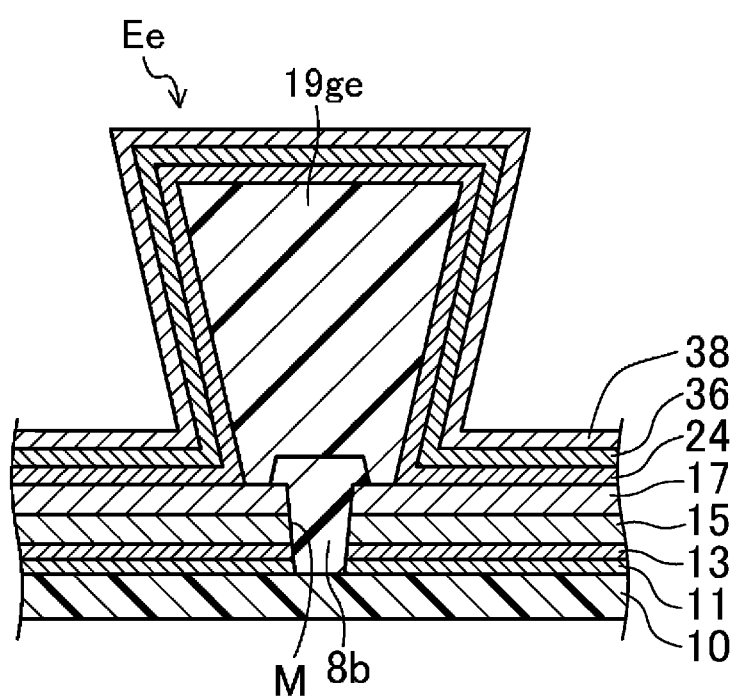
FIG. 13 is a cross-sectional view of a fourth modification example of a separation wall configuring the organic EL display device according to the first embodiment of the disclosure.

FIG. 13 is a cross-sectional view of a separation wall Ee that is a fourth modification example of the separation wall Ea.

The separation wall Ee has substantially the same configuration as the separation wall Eb of the first modification example, and, as illustrated in FIG. 13, a resin filling layer 8b is provided on the resin substrate layer 10 side of the separation wall Ee, and the resin layer 19ge is provided on the resin filling layer 8b.

As illustrated in FIG. 13, the resin filling layer 8b is disposed to fill an opening portion M formed in the base coat film 11, the gate insulating film 13, the first interlayer insulating film 15, and the second interlayer insulating film 17. Here, as illustrated in FIG. 13, the opening portion M is provided in a frame shape in the base coat film 11, the gate insulating film 13, the first interlayer insulating film 15, and the second interlayer insulating film 17 to overlap the separation wall Eg and pass through the base coat film 11, the gate insulating film 13, the first interlayer insulating film 15, and the second interlayer insulating film 17, and is formed at the same time as when the line-like slit Sa of the bending portion B is formed. In addition, the resin filling layer 8b is formed of the same material as that of the lower-layer flattening film 8a, which is disposed in the bending portion B, in the same layer and is formed at the same time as when the lower-layer flattening film 8a is formed.

The resin layer 19ge is formed of the same material as that of the flattening film 19a in the same layer and is formed at the same time as when the flattening film 19a is formed in the TFT layer forming step described above. Here, as illustrated in FIG. 13, both side surfaces of the resin layer 19ge are inclined in a reverse tapered shape in which a width between both side surfaces gradually decreases toward the resin substrate layer 10. In FIG. 13, while the second electrode 24, the second inorganic insulating film 36, and the third inorganic insulating film 38 are illustrated as covering the resin layer 19ge, (the common function layer,) the second electrode 24, the second inorganic insulating film 36, and the third inorganic insulating film 38 are provided to be separated or to have a relatively low density below both side surfaces of the resin layer 19ge inclined in a reverse tapered shape.

According to the organic EL display device including the separation wall Ee having the configuration described above, the resin filling layer 8b is provided to fill the opening portion M formed in the base coat film 11, the gate insulating film 13, the first interlayer insulating film 15, and the second interlayer insulating film 17. Therefore, for example, propagation of cracks generated in the base coat film 11, the gate insulating film 13, the first interlayer insulating film 15, and the second interlayer insulating film 17 on the through-hole H side to the display region D side can be inhibited. In addition, the resin filling layer 8b is provided so as to overlap the separation wall Ee, and thus a distance from the through-hole H to a boundary between the non-display region N and the display region D can be shortened even when a structure for inhibiting propagation of cracks is employed.

Fifth Modification Example

Figure 14:
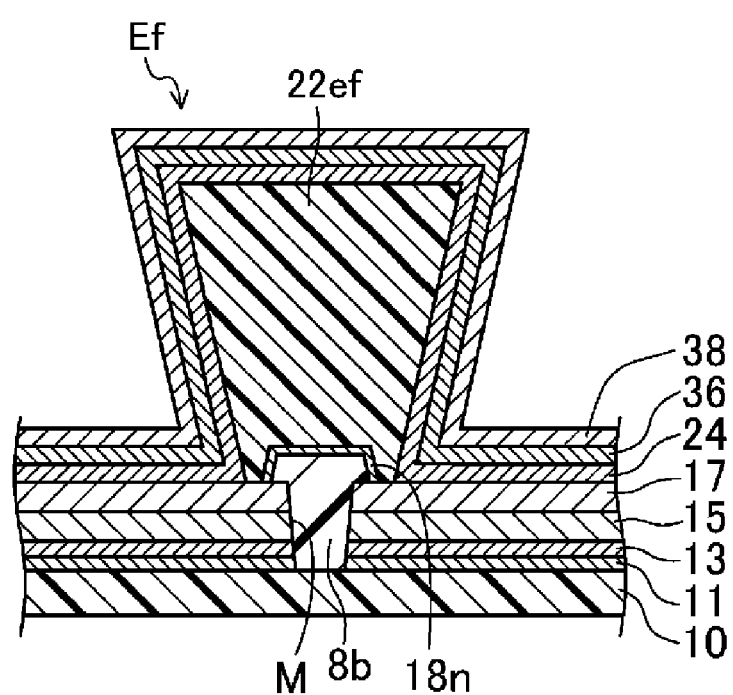
FIG. 14 is a cross-sectional view of a fifth modification example of a separation wall configuring the organic EL display device according to the first embodiment of the disclosure.

FIG. 14 is a cross-sectional view of a separation wall Ef that is a fifth modification example of the separation wall Ea.

The separation wall Ef has substantially the same configuration as the separation wall Ea of the present embodiment, and, as illustrated in FIG. 14, the resin filling layer 8b is provided on the resin substrate layer 10 side of the separation wall Ef, and the resin layer 22ef is provided on the resin filling layer 8b via the metal layer 18n.

As illustrated in FIG. 14, the metal layer 18n is provided to cover a portion of the resin filling layer 8b protruding from the second interlayer insulating film 17. Here, the metal layer 18n is formed of the same material as that of the source line 18f or the power source line 18g in the same layer and is formed at the same time as when the source line 18f and the power source line 18g are formed.

The resin layer 22ef is formed of the same material as that of the edge cover 22a in the same layer and is formed at the same time as when the edge cover 22a is formed in the organic EL element layer forming step described above. Here, as illustrated in FIG. 14, both side surfaces of the resin layer 22ef are inclined in a reverse tapered shape in which a width between both side surfaces gradually decreases toward the resin substrate layer 10. In FIG. 14, while the second electrode 24, the second inorganic insulating film 36, and the third inorganic insulating film 38 are illustrated as covering the resin layer 22ef, (the common function layer,) the second electrode 24, the second inorganic insulating film 36, and the third inorganic insulating film 38 are provided to be separated or to have a relatively low density below both side surfaces of the resin layer 22ef inclined in a reverse tapered shape.

According to the organic EL display device including the separation wall Ef having the configuration described above, the resin filling layer 8b is provided to fill the opening portion M formed in the base coat film 11, the gate insulating film 13, the first interlayer insulating film 15, and the second interlayer insulating film 17. Therefore, for example, propagation of cracks generated in the base coat film 11, the gate insulating film 13, the first interlayer insulating film 15, and the second interlayer insulating film 17 on the through-hole H side to the display region D side can be inhibited. In addition, the resin filling layer 8b is provided so as to overlap the separation wall Ef, and thus a distance from the through-hole H to a boundary between the non-display region N and the display region D can be shortened even when a structure for inhibiting propagation of cracks is employed. In addition, since the metal layer 18n having ductility is provided between the resin filling layer 8b and the resin layer 22ef, for example, propagation of cracks to the resin filling layer 8b can be inhibited even when cracks generated in the second inorganic insulating film 36 and the third inorganic insulating film 38 on the through-hole H side propagate to the resin layer 22ef.

As described above, according to the organic EL display device 50 of the present embodiment, the separation wall Ea is provided in a frame-like shape along a peripheral edge of the through-hole H in the non-display region N which is defined to be in an island shape inside the display region D and in which the through-hole H is formed. Here, since both side surfaces of the separation wall Ea are inclined in a reverse tapered shape in which a width between both side surfaces gradually decreases toward the resin substrate layer 10 side, the common function layers (the hole injection layer 1, the hole transport layer 2, the electron transport layer 4, and the electron injection layer 5) and second electrode 24 are provided to be separated or to have a relatively low density below both side surfaces of the separation wall Ea. Furthermore, in the common function layers (the hole injection layer 1, the hole transport layer 2, the electron transport layer 4, and the electron injection layer 5), and the second electrode 24, the frame-like slit Sb is provided to surround the separation wall Ea on the display region D side of the separation wall Ea and to pass through the common function layers and the second electrode 24. In this way, even when the common function layers (the hole injection layer 1, the hole transport layer 2, the electron transport layer 4, and the electron injection layer 5) and the second electrode 24 are provided to have a relatively low density below both side surfaces of the separation wall Ea, the display region D side and the through-hole H side are separated from each other by the frame-like slit Sb, and thus the common function layers (the hole injection layer 1, the hole transport layer 2, the electron transport layer 4, and the electron injection layer 5) and the second electrode 24 can be formed with the display region D side and the through-hole H side being reliably separated from each other.

Second Embodiment

Figure 15:
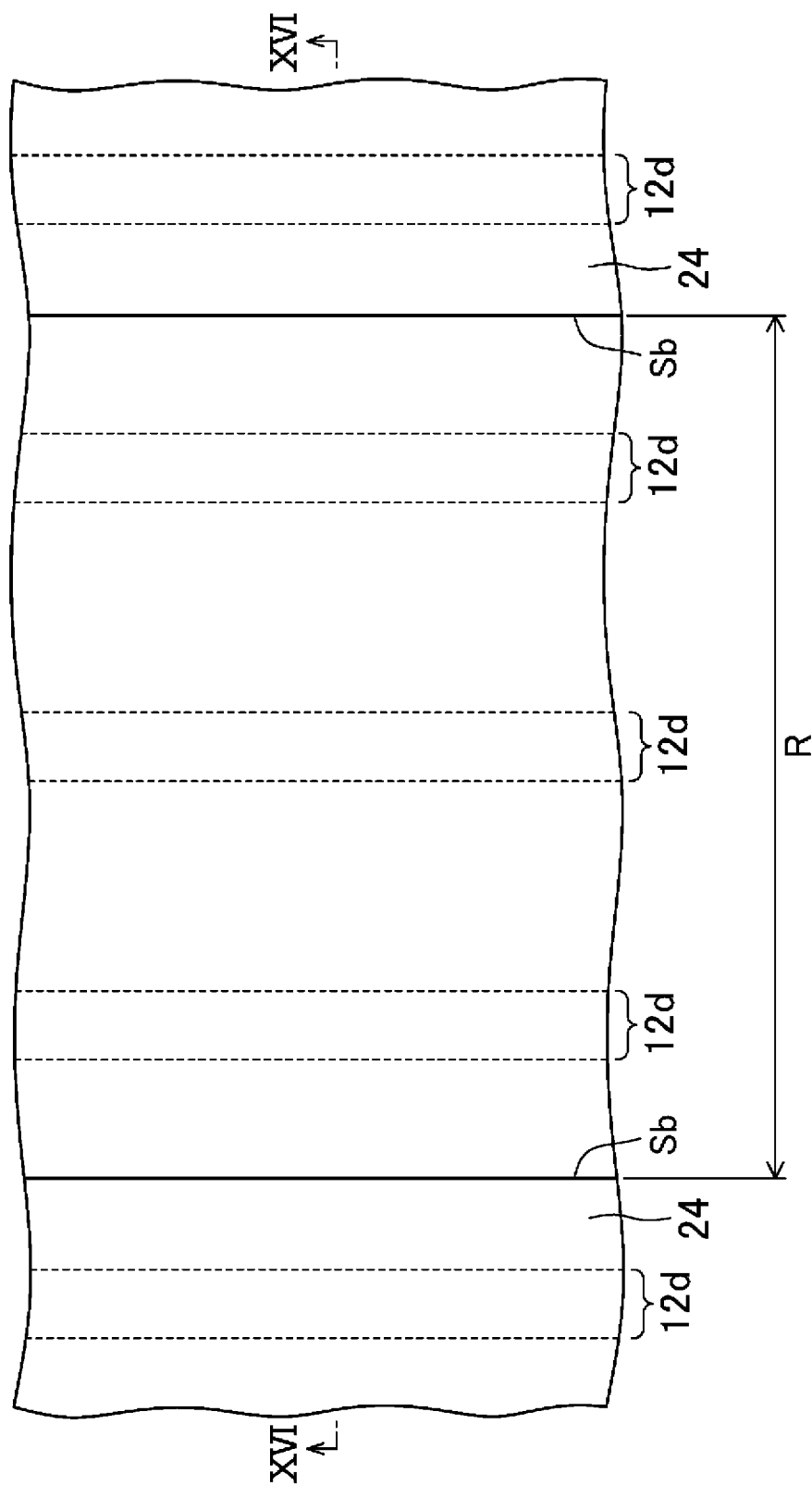
FIG. 15 is an enlarged plan view of an irradiation region of laser light prior to formation of a sealing film in the organic EL display device according to the second embodiment of the disclosure.

FIGS. 15 and 16 illustrate a second embodiment of the display device according to the disclosure. Here, FIG. 15 is an enlarged plan view of an irradiation region R of laser light prior to formation of the sealing film 40 in an organic EL display device according to the present embodiment. FIG. 16 is a cross-sectional view of the irradiation region R of laser light taken along a line XVI-XVI illustrated in FIG. 15. Furthermore, in the following embodiments, portions identical to those in FIGS. 1 to 14 are denoted by the same reference signs, and a detailed description thereof are omitted.

Although the first embodiment described above only deals with a configuration in which only inorganic insulating films are provided on the resin substrate layer 10 in the irradiation region R to which laser light is emitted to form the frame-like slit Sb, a photo-thermal conversion layer may be provided between the inorganic insulating films.

More specifically, as illustrated in FIGS. 15 and 16, a plurality of photo-thermal conversion layers 12d are provided between the base coat film 11 and the gate insulating film 13 in the irradiation region R.

As illustrated in FIGS. 15 and 16, the photo-thermal conversion layers 12d are provided in a frame shape at least inside the frame-like slit Sb. Here, the photo-thermal conversion layer 12d is formed of the same material as that of the semiconductor layers 12a and 12b in the same layer and is formed at the same time as when the semiconductor layers 12a and 12b are formed in the TFT layer forming process described above. In the present embodiment, although the photo-thermal conversion layer 12d formed of the same material as that of the semiconductor layers 12a and 12b in the same layer is illustrated, the photo-thermal conversion layer 12d, for example, may be formed using a metal layer disposed between the gate insulating film 13 and the first interlayer insulating film 15, between the first interlayer insulating film 15 and the second interlayer insulating film 17, or between the second interlayer insulating film 17 and the flattening film 19a.

As described above, according to the organic EL display device of the present embodiment, similar to the organic EL display device 50 according to the first embodiment described above, the common function layers (the hole injection layer 1, the hole transport layer 2, the electron transport layer 4, and the electron injection layer 5) and the second electrode 24 can be formed with the display region D side and the through-hole H side being reliably separated.

In addition, according to the organic EL display device of the present embodiment, the plurality of photo-thermal conversion layers 12d are provided in a frame shape in the irradiation region R of laser light, and thus the common function layers (the hole injection layer 1, the hole transport layer 2, the electron transport layer 4, and the electron injection layer 5) and the second electrode 24 can be reliably removed even when the emitted laser light is out of focus.

In addition, according to the organic EL display device of the present embodiment, since the common function layers (the hole injection layer 1, the hole transport layer 2, the electron transport layer 4, and the electron injection layer 5) and the second electrode 24 arranged in the irradiation region R of laser light are reliably removed, the second inorganic insulating film 36 of the sealing film 40 is reliably in contact with the second interlayer insulating film 17 of the TFT layer 20, and the sealing performance of the sealing film 40 can be further improved.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In each of the embodiments described above, the organic EL display device 50 in which the through-hole H having a circular shape in a plan view is formed is exemplified. However, for example, the through-hole H may have a polygonal shape such as a rectangular shape in a plan view.

In each of the embodiments described above, the organic EL display device 50 including the sealing film 40 in which the organic insulating film 37 is provided between the second inorganic insulating film 36 and the third inorganic insulating film 38 is exemplified. However, the disclosure is also applicable to an organic EL display device in which an organic vapor deposition film is formed between the second inorganic insulating film 36 and the third inorganic insulating film 38, and thereafter ashing is performed on the organic vapor deposition film to cover foreign matters with the organic vapor deposition film. According to such a configuration of the sealing film, even when foreign matters are present on the display region, sealing performance can be secured by the third inorganic insulating film, whereby the reliability can be improved.

In each of the embodiments described above, the organic EL display device is exemplified and described as the display device. However, the disclosure is not limited to the organic EL display device and also applicable to any display device as far as the display device has flexibility. For example, the disclosure is applicable to a flexible display device including QLEDs or the like that are light-emitting elements using a quantum dot containing layer.

INDUSTRIAL APPLICABILITY

As described above, the disclosure is useful for a flexible display device.

The invention claimed is:
1. A display device comprising:
a base substrate;
a thin film transistor layer disposed on the base substrate and including a first inorganic insulating film;
a light-emitting element layer disposed on the thin film transistor layer, the light-emitting element layer comprising a plurality of light-emitting elements arranged in correspondence with a plurality of subpixels configuring a display region; and
a sealing film disposed on the light-emitting element layer to cover the plurality of light-emitting elements, the sealing film comprising a second inorganic insulating film, an organic insulating film, and a third inorganic insulating film that are sequentially stacked,
wherein a frame region is provided around the display region,
a non-display region is provided in an island shape inside the display region,
an external dam wall is provided in a frame shape in the frame region to surround the display region and overlap a circumferential end portion of the organic insulating film,
a first electrode, a function layer, and a second electrode are sequentially stacked in each of the plurality of light-emitting elements,
a through-hole extending through the base substrate in a thickness direction of the base substrate is formed in the non-display region,
a separation wall is provided in a frame shape along a circumferential edge of the through-hole in the non-display region,
both side surfaces of the separation wall are inclined in a reverse tapered shape in which a width between the both side surfaces gradually decreases toward a side of the base substrate,
an internal dam wall is provided in a frame shape to overlap the circumferential end portion of the organic insulating film on a display region side of the separation wall in the non-display region,
the function layer includes a common function layer provided to be common to the plurality of subpixels,
a frame-like slit is provided in the common function layer to surround the separation wall on the display region side of the separation wall and to pass through the common function layer, and
the first inorganic insulating film and the second inorganic insulating film are in contact with each other in the frame-like slit.
2. The display device according to claim 1,
wherein the light-emitting element layer includes an edge cover disposed to cover a circumferential end portion of a first electrode of each of the plurality of light-emitting elements, and
the separation wall is formed of a same material as that of the edge cover in a same layer.
3. The display device according to claim 1,
wherein the thin film transistor layer further includes a flattening film disposed on a light-emitting element layer side, and
the separation wall is formed of a same material as that of the flattening film in a same layer.
4. The display device according to claim 1,
wherein the light-emitting element layer includes an edge cover disposed to cover a circumferential end portion of a first electrode of each of the plurality of light-emitting elements,
the thin film transistor layer further includes a flattening film disposed on a light-emitting element layer side, and
the separation wall includes a lower-layer resin layer formed of a same material as that of the flattening film in a same layer and an upper-layer resin layer formed of a same material as that of the edge cover in a same layer.

5. The display device according to claim 1,
wherein a metal layer is disposed between the separation wall and the second inorganic insulating film.

6. The display device according to claim 1,
wherein an opening portion is provided in a frame shape in the first inorganic insulating film to overlap the separation wall and pass through the first inorganic insulating film,
a resin filling layer is provided in the opening portion to fill the opening portion, and
the separation wall is disposed on the resin filling layer.

7. The display device according to claim 6,
wherein a metal layer is disposed between the resin filling layer and the separation wall.

8. The display device according to claim 1,
wherein the thin film transistor layer further includes a plurality of inorganic films,
a layered thick film portion acquired by stacking the plurality of inorganic films along a circumferential edge of the through-hole is provided in a frame shape between the separation wall and the through-hole, and
a total thickness of the plurality of inorganic films in the layered thick film portion is larger than a total thickness of the plurality of inorganic films between the layered thick film portion and the separation wall.

9. The display device according to claim 8,
wherein the first inorganic insulating film is included in the plurality of inorganic films.

10. The display device according to claim 9,
wherein a thick film semiconductor layer, formed of a same material as that of a semiconductor layer configuring the thin film transistor layer in a same layer, is included in the plurality of inorganic films.

11. The display device according to claim 9,
wherein a thick film metal layer, formed of a same material as that of a metal layer configuring the thin film transistor layer in a same layer, is included in the plurality of inorganic films.

12. The display device according to claim 8,
wherein a thick film resin layer is provided in a frame shape on the layered thick film portion to overlap the layered thick film portion.

13. The display device according to claim 1,
wherein a plurality of photo-thermal conversion layers is provided in a frame shape inside the frame-like slit.

14. The display device according to claim 13,
wherein the thin film transistor layer includes a semiconductor layer provided for each of the plurality of subpixels, and
each of the photo-thermal conversion layers is formed of a same material as that of the semiconductor layer in a same layer.

15. The display device according to claim 1,
wherein the plurality of light-emitting elements is organic electroluminescence elements.

* * * * *